(12) United States Patent
Maier et al.

(10) Patent No.: US 11,338,670 B2
(45) Date of Patent: May 24, 2022

(54) TRANSMISSION WITH POWER ELECTRONICS MODULE

(71) Applicant: ZF Friedrichshafen AG, Friedrichshafen (DE)

(72) Inventors: Thomas Maier, Neunburg v. Wald (DE); Hermann Josef Robin, Regensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 27 days.

(21) Appl. No.: 16/868,281

(22) Filed: May 6, 2020

(65) Prior Publication Data
US 2020/0353814 A1    Nov. 12, 2020

(30) Foreign Application Priority Data

May 7, 2019   (DE) .......................... 102019206525.2

(51) Int. Cl.
| | |
|---|---|
| *B60K 17/08* | (2006.01) |
| *F16H 61/00* | (2006.01) |
| *H02K 11/33* | (2016.01) |
| *F16H 57/04* | (2010.01) |
| *H05K 7/20* | (2006.01) |
| *H02K 5/22* | (2006.01) |

(52) U.S. Cl.
CPC ......... *B60K 17/08* (2013.01); *F16H 57/0424* (2013.01); *F16H 61/0006* (2013.01); *H02K 5/225* (2013.01); *H02K 11/33* (2016.01); *H05K 7/20909* (2013.01)

(58) Field of Classification Search
CPC . B60K 17/08; F16H 57/0424; F16H 61/0006; F16H 2057/02026; F16H 2057/02034; F16H 2057/02086; F16H 2057/02091; F16H 2057/02095; H02K 5/225; H02K 7/20909; F01P 2060/045
See application file for complete search history.

(56) References Cited

U.S. PATENT DOCUMENTS

| | | | |
|---|---|---|---|
| 8,248,800 B2 * | 8/2012 | Takata ................ | F16H 61/0006 361/699 |
| 9,802,470 B2 * | 10/2017 | Miyazawa .............. | B60L 50/16 |
| 2014/0084719 A1 * | 3/2014 | Asakura ................... | H02K 9/19 310/54 |
| 2016/0039276 A1 * | 2/2016 | Takahashi ................ | B60K 6/36 180/65.21 |

FOREIGN PATENT DOCUMENTS

| | | |
|---|---|---|
| DE | 10 2010 002 746 A1 | 9/2011 |
| DE | 10 2017 212 677 A1 | 1/2019 |

* cited by examiner

*Primary Examiner* — Thomas C Diaz
(74) *Attorney, Agent, or Firm* — Crowell & Moring LLP

(57) ABSTRACT

A transmission may include a housing and also a power electronics module, the power electronics module including a carrier element with at least one power switching element with a cooling surface and also a cooling body, which may be connected in a thermally conductive manner to the cooling surface of the at least one power switching element. The housing may have an oil space for at least partially accommodating transmission components. The power electronics module may be at least partially arranged inside the oil space of the transmission.

17 Claims, 3 Drawing Sheets

TRANSMISSION WITH POWER ELECTRONICS MODULE

RELATED APPLICATION

This application claims the benefit of, and priority to, German Patent Application DE 10 2019 206 525.2, filed May 7, 2019, which is incorporated by reference herein in its entirety.

TECHNICAL FIELD

The invention relates to a transmission, and also to a motor vehicle with such a transmission.

BACKGROUND

DE 10 2010 002 746 A1 describes such a transmission, which has an electric machine arranged inside a transmission bell of the transmission housing. The electric machine is coupled to assigned power electronics, the power electronics being provided in a cover structure of the transmission housing and being connected to the electric machine via a phase interface. The cover structure is detachably fastened to the transmission housing in the region of the transmission bell radially below the electric machine. By the power electronics being attached in such a way, the ground clearance of a motor vehicle with such a transmission is reduced.

DE 10 2017 212 677 A1 describes a transmission of the type in question. Here, the housing of the transmission has on an outer wall a region for accommodating the power electronics module. This region can be closed by a carrier element of the power electronics module. The outer wall of the housing and the inner side of the carrier element form a dry space, in which the power electronics module is accommodated. The region of the housing in which the power electronics module is accommodated separates the gear set of the transmission at least in a certain portion or in certain portions from the dry space of the inverter.

BRIEF DESCRIPTION OF THE DRAWINGS

The invention is explained in more detail by way of example on the basis of the accompanying drawings, in which.

DETAILED DESCRIPTION

Figure 1:
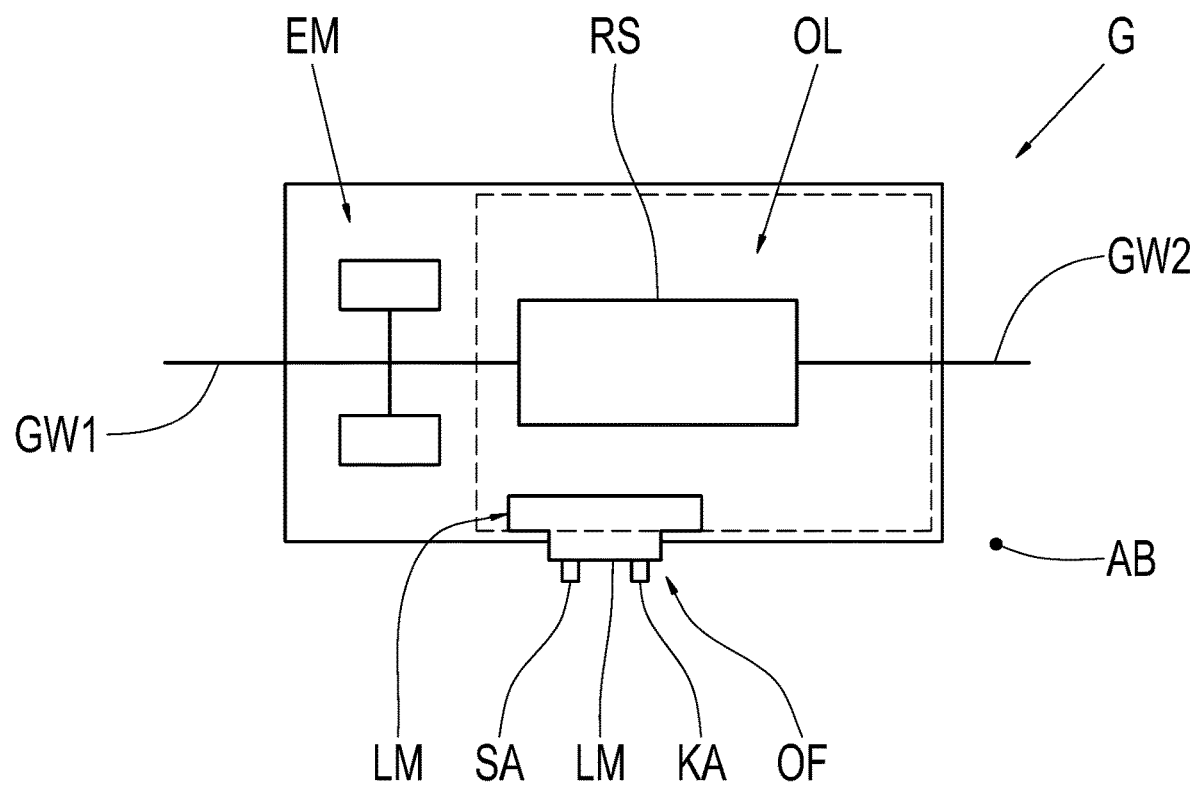
FIG. 1 shows a schematic view of a transmission according to the invention.

Herein, a transmission refers to any type of transmission, and in particular (for example) to a multi-ratio transmission in which a multiplicity of gears, that is to say fixed transmission ratios, between an input shaft and an output shaft of the transmission can be selected, preferably automatically, by means of switching elements. The switching elements are in this case for example clutches or brakes. Such transmissions are used in particular in motor vehicles for the purposes of suitably adapting the rotational speed and torque output characteristics of the drive unit to the driving resistances of the vehicle.

In view of the background above, the present disclosure describes an improved transmission having a compact overall height without significantly increasing the outer dimensions of the transmission.

The transmission comprises a housing and also a power electronics module. The power electronics module comprises a carrier element with at least one power switching element with a cooling surface and also a cooling body, which is connected in a thermally conductive manner to the cooling surface of the at least one power switching element. The housing also has an oil space for at least partially accommodating transmission components. The power electronics module is at least partially arranged inside the oil space of the transmission.

The positioning of the power electronics module inside the housing of the transmission allows a more compact type of construction of the transmission to be achieved. Existing installation space in the oil space of the transmission can consequently be used better, whereby the dimensions of the transmission can be reduced. Furthermore, there is no longer any need for complex structures to create dry spaces for accommodating the power electronics module.

Inside the housing of the transmission there is a gear set for forming multiple gears between an input shaft and an output shaft of the transmission. The transmission may also comprise an electric machine, which is operatively connected to the input shaft, the output shaft or an element of the gear set.

The carrier element of the power control module may be for example a circuit board, also referred to as a board or PCB (Printed Circuit Board). Depending on the embodiment, the carrier element may be loaded with electronic components on one side or on both sides. A power switching element may be understood as meaning an electronic switch, for instance a MOSFET, IGBT, thyristor or some other semiconductor-based power switch. In particular, the power switching element may be output stages of an amplifier circuit. In this case, multiple power switching elements may be connected to one another in parallel. A cooling body may be a body of a material with comparatively high thermal conductivity, in particular a metal plate, such as for instance a copper plate or a plate of some other suitable metal. The cooling body may for example also be realized as a composite of different materials. A cooling body may be understood as meaning generally a body acting as a heat sink which, due to its geometry or its material properties, can take up heat and give it off again particularly well. For example, the cooling body may be a housing of the power control module, or at least a portion of it. The cooling body may also be a separate component, for instance a transmission component or some other part of a vehicle acting as a heat sink. The cooling body may for example also be realized as a metal insert, for instance for placing in an injection-moulded housing.

The power electronics module may at least partially form a sealing plane between the oil space of the transmission and a dry space or the outside region of the transmission. As a result, at least a certain portion of the power electronics module forms a portion of the housing of the transmission. This makes it possible to dispense with a portion of the transmission housing, whereby costs can be saved in the production process of the transmission. Furthermore, the omitted portion of the transmission housing means that weight is saved, whereby the fuel consumption of the motor vehicle can be reduced.

A further advantage of at least partial integration of the power electronics module in the oil space of the transmission is that, as a result, routings to an electric machine integrated in the transmission housing or to the position sensors integrated in the transmission housing can be shortened.

The power electronics module may have connections for supplying coolant, i.e. for feeding in coolant and removing coolant. These connections may be arranged outside the oil space of the transmission. The term "outside" should be understood here as meaning that the connections are not arranged inside the oil space of the transmission. Consequently, oil does not flow around the connections for supplying coolant. One advantage of this is that, in the event of a possible leakage of the coolant supply, no coolant, for example water, gets into the oil space of the transmission.

The power electronics module may have an arrangement for feeding power lines and/or data lines to the carrier element. The power lines and/or data lines may in this case be connected either directly to the carrier element, for example to the circuit board, or to the electronic components arranged on the carrier element, for example power switches. It is however also possible that the arrangement for feeding the power lines and/or data lines to the carrier element is a connector arrangement. This connector arrangement may in this case be formed in such a way that it extends from the carrier element into a region of the transmission that is free from oil. Here, a region of the transmission that is free from oil may on the one hand be a dry space within the transmission. On the other hand, a region of the transmission that is free from oil may also be a region outside the transmission.

The cooling body, which can be supplied with coolant by way of the coolant feed, may at least largely be made of copper and/or comprise copper as a main constituent. For example, the cooling body may take the form of a copper plate or copper sheet. Alternatively, the cooling body may be made of a copper-containing alloy. As a result, it is made possible for heat to be transported away efficiently, while production costs are comparatively low.

For efficient heat removal, the cooling surface of the power switching element may for example be coupled to the cooling body by way of heat-conductive intermediate elements.

The power electronics module may be at least partially encapsulated in an oil-tight manner with a moulding compound. The moulding compound serves in this case substantially as a housing for the carrier element with the power switches arranged on it, and consequently represents the housing of the power electronics module. The use of a moulding compound makes it possible to surround the power electronics module with a housing in a way adapted to the available installation space. Furthermore, weight and production costs can be saved as a result. The use of a moulding compound also makes it possible to dispense with additional sealing elements between possible housing parts or between a housing and the carrier element. In addition, it is possible that the moulding compound is only provided on the power electronics module in a certain portion or in certain portions. The moulding compound may be understood for instance as meaning a plastic or a plastic-containing composite material. As a result, the housing can be produced particularly inexpensively and compactly.

Optionally, a transmission control module that is at least partially integrated in the power electronics module may be provided. As a result, it is possible to save installation space, since the transmission control module and the power electronics module can be combined in a single module.

In a development, the cooling body is of a multi-part form. In this case, for example, a first cooling body part may be integrated in the power electronics module and a further cooling body part can for example be screwed, adhesively attached or clipped or connected by means of a soldered or welded connection to the first cooling body part. Here, the first cooling body part and the further cooling body part may be connected to one another in a material-bonding manner. Here it is also possible that the connections for supplying coolant, i.e. for feeding in coolant and removing coolant, are connected to the further cooling body part.

The transmission may be a component part of a motor vehicle. The motor vehicle has not only the transmission but also an internal combustion engine, which can be connected or connectable rotationally elastically to the input shaft of the transmission by means of a torsional vibration damper. The output shaft of the transmission is operatively connected in terms of drive to a transmission-internal or transmission-external differential transmission, which is operatively connected to wheels of the motor vehicle. The motor vehicle with the transmission makes multiple driving modes of the motor vehicle possible. In an electrical driving mode, the motor vehicle is driven by the electric machine of the transmission. In an engine mode, the motor vehicle is driven by the internal combustion engine. In a hybrid mode, the motor vehicle is driven both by the internal combustion engine and by the electric machine of the transmission. A motor vehicle may however also be understood as meaning a commercial vehicle or a rail vehicle.

The transmission may however also be a component part of a stationary transmission, for example in a wind turbine.

DETAILED DESCRIPTION

In the following description of certain exemplary embodiments, the same or similar designations are used for the elements that are represented in the various figures and act in a similar way, without the description of these elements being repeated.

FIG. 1 shows a schematic view of a transmission G. The transmission G has a housing GG, a gear set RS arranged inside the housing GG and also an input shaft GW1 and an output shaft GW2. The gear set RS serves for forming multiple gears between the input shaft GW1 and the output shaft GW2. The transmission G also has an electric machine EM, the rotor of which is operatively connected to the input shaft GW1.

The transmission housing GG also encloses an oil space OL (represented by dashed lines), in which the gear set RS is arranged. The transmission housing GG and the oil space OL have a common opening OF. Arranged in this opening OF is the power electronics module LM. The power electronics module LM has cooling connections KA, which extend from the power electronics module LM into the outside region AB of the transmission G. There is also a connector arrangement SA for feeding power lines and/or data lines to the power electronics module LM. This connector arrangement SA is connected to the power electronics module LM and extends from the power electronics module LM into the outside region AB of the transmission G.

Figure 2:
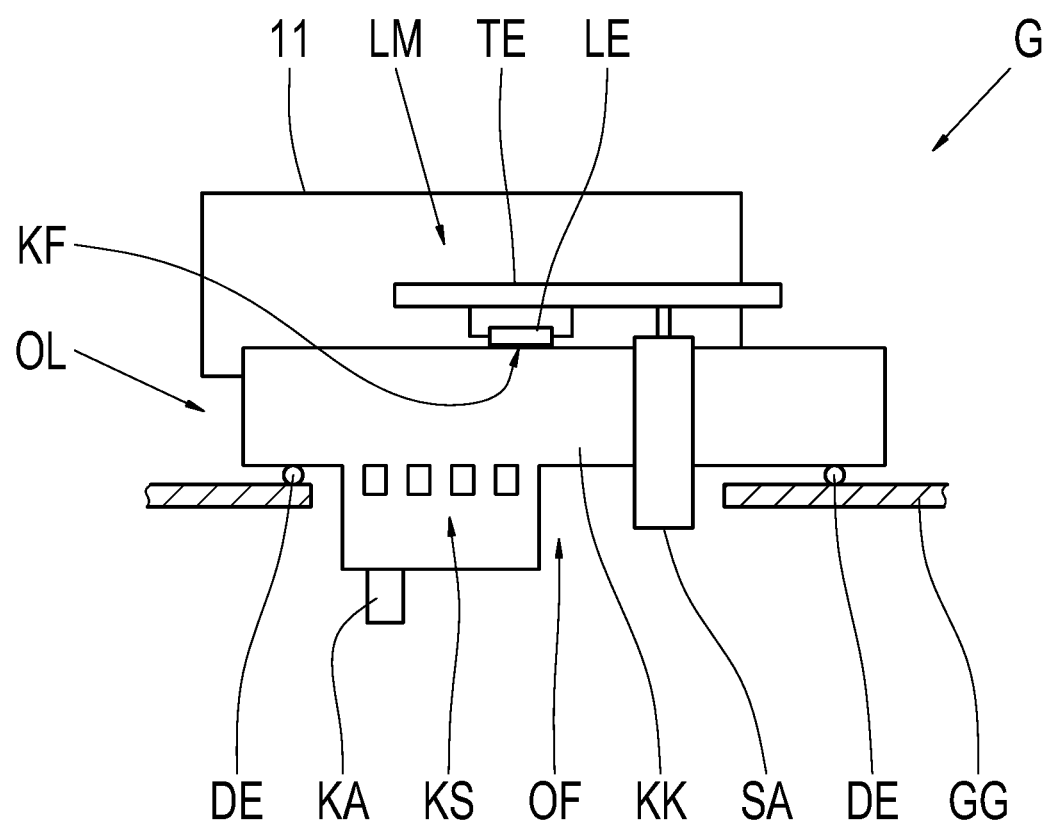
FIG. 2 shows a sectional representation of a detail, given by way of example, of a transmission according to the invention in a first embodiment.

FIG. 2 shows a sectional representation, given by way of example, of a detail of a transmission is shown with a first design variant. FIG. 2 shows here a transmission G with a transmission housing GG. Here, the transmission housing GG separates the oil space OL, in which for example the gear set (not shown) is arranged, from the outside region AB of the transmission G. The outside region GG of the transmission G may in this case also represent a dry space of the transmission G. The transmission housing GG has an opening OF. Arranged in this opening OF is the power electronics module LM. The power electronics module LM consequently forms a sealing plane of the transmission G. In particular, the power electronics module LM is sealed with respect to the transmission housing GG, so that no oil can escape from the oil space OL into the outside region AB.

The power electronics module LM has a carrier element TE, for example a circuit board, and also a cooling body KK. Arranged by way of example on the carrier element TE is a power switching element LE. This power switching element LE has a cooling surface KF. The cooling surface KF of the power switching element LE is thermally connected to the cooling body KK. The thermal coupling is performed here by means of measures familiar to a person skilled in the art. The cooling body KK has a cooling structure KS, in which fed-in cooling medium can circulate, in order in this way to transport away the heat given off by the power switching element LE to the cooling body KK.

The power electronics module LM is in this case at least partially inside the oil space OL of the transmission G. The power electronics module LM lies here against an inner surface of the transmission housing GG. To improve the sealing between the oil space OL and an outside region AB of the transmission G, there are sealing elements DE between the inner surface OL and the power electronics LM. Here, the sealing elements DE may run completely around the opening OF in the transmission housing GG. However, it is also possible that the sealing elements DE run around a certain portion or certain portions of the opening OF. It goes without saying that the sealing elements DE may also be formed by a kind of tongue-and-groove connection between the transmission housing GG and the power electronics module LM.

The cooling body KK is of a one-part form in FIG. 2, in such a way that the cooling body KK reaches through the opening OF in the transmission housing GG. The cooling body KK has a coolant connection KA for feeding coolant into the cooling body KK. This coolant connection KA extends into the outside region AB of the transmission. Here, this outside region AB may be a dry space inside the housing GG or a region outside the transmission housing GG.

The power electronics module LM has a connector arrangement SA. This connector arrangement SA is connected to the carrier element TE and extends in the direction of an outside region AB of the transmission.

The power electronics module LM has an overmoulding with a moulding compound M. Here, the moulding compound M surrounds the carrier element T1 at least in a certain portion or in certain portions, so that in particular the power switching element LE is closed off in an oil-tight manner. The moulding compound also at least partially encloses the connector arrangement SA. By way of example, the connector arrangement SA reaches through the cooling body KK. It is however also possible that the connector arrangement SA is led from the carrier element TE alongside the cooling body KK into the outside region AB of the transmission G.

Figure 3:
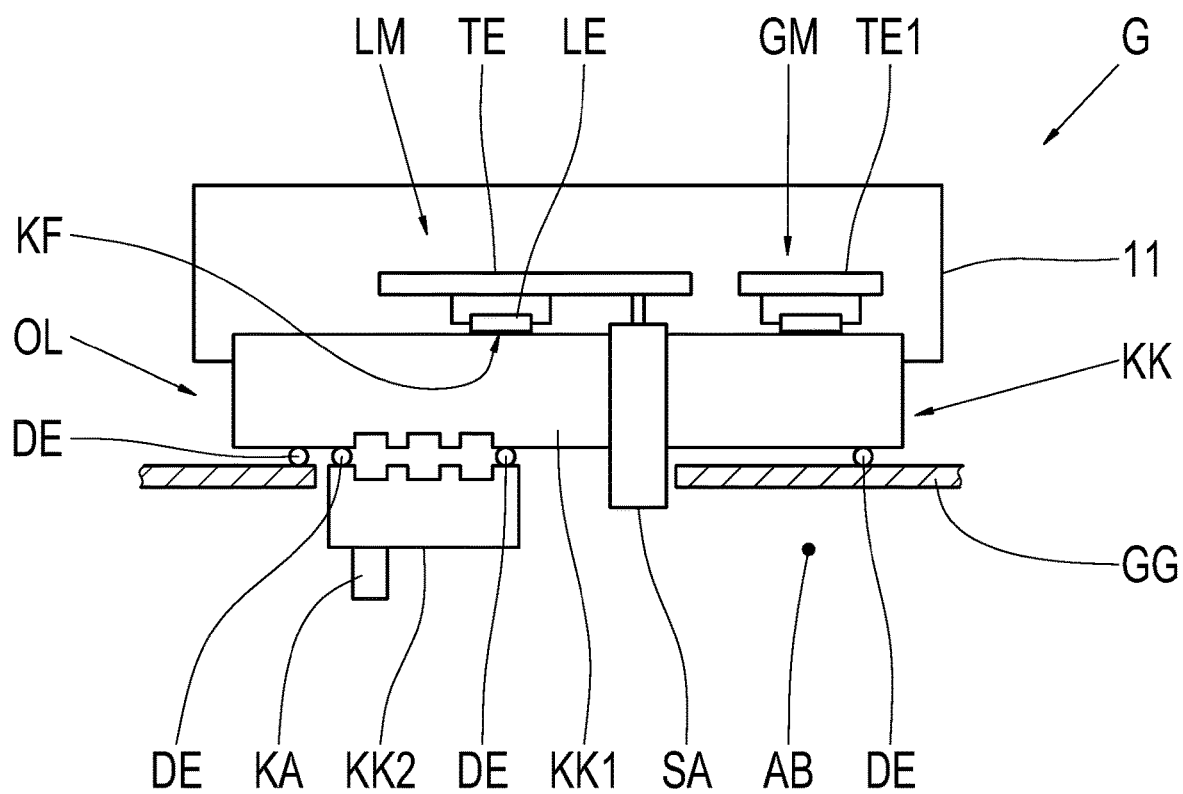
FIG. 3 shows a sectional representation of a detail, given by way of example, of a transmission according to the invention in a second embodiment.

FIG. 3 shows a sectional representation of a detail, given by way of example, of a transmission according to a second embodiment. This embodiment corresponds substantially to the first embodiment. The difference is substantially in the design of the cooling body KK. The cooling body KK has a first cooling element KK1 and a second cooling element KK2. The first cooling element KK1 of the cooling body KK lies here on the inner surface OL of the transmission housing GG and is located here completely inside the transmission housing GG, and consequently in the oil space OL. The second cooling element KK2 reaches from an outside region AB of the transmission G through the opening OF in the transmission housing GG. Here, the first cooling element KK1 and the second cooling element KK2 are screwed, adhesively bonded or welded to one another. It is possible that a thermally conductive sealing element (not shown) is incorporated between the first cooling element KK1 and the second cooling element KK2. The first cooling element KK1 and the second cooling element KK2 have on opposing surfaces structures that form a cooling structure KS for a cooling medium when the two elements KK1, KK2 are joined together.

The power electronics module LM additionally comprises a transmission control module GM. This transmission control module GM comprises by way of example a further carrier element TE1. It is also possible however that the transmission control module GM is arranged on the carrier element of the power electronics module LM.

The exemplary embodiments described and shown in the figures are chosen merely by way of example. Different exemplary embodiments may be combined with one another completely or with respect to individual features. One exemplary embodiment may also be supplemented by features of another exemplary embodiment.

Furthermore, method steps may be repeated and carried out in a sequence other than that described.

If an exemplary embodiment comprises an "and/or" conjunction between a first feature and a second feature, this can be read as meaning that, according to one embodiment, the exemplary embodiment comprises both the first feature and the second feature and, according to a further embodiment, the exemplary embodiment comprises either only the first feature or only the second feature.

REFERENCE SYMBOLS

G Transmission
GG Transmission housing
GW1 Input shaft
GW2 Output shaft
TE Carrier element
TE1 Further carrier element
RS Gear set
EM Electric machine
OL Oil space
OF Opening
LM Power electronics module
LE Power switching element
KK Cooling body
KK1 First cooling element
KK2 Second cooling element
KF Cooling surface
KS Cooling structure
SA Connector arrangement
KA Cooling connection
GM Transmission control module
AB Outside region

We claim:
1. A transmission, the transmission comprising:
a housing; and
a power electronics module, the power electronics module comprising:
a carrier element with at least one power switching element having a cooling surface; and
a cooling body, wherein the cooling body is connected in a thermally conductive manner to the cooling surface of the at least one power switching element, wherein the housing has an oil space, and wherein the power electronics module is at least partially located inside the oil space of the transmission, wherein the cooling body extends through an opening of the housing such that a first portion of the cooling body is within the housing and a second portion of the cooling body is outside the housing, and wherein the cooling body includes a first cooling element forming the first portion of the cooling body and a second cooling element forming the second portion of the cooling body, wherein at least one cooling structure is included between the first cooling element and the second cooling element, and wherein the at least one cooling structure is configured for receiving a cooling medium circulating through the cooling body.

2. The transmission according to claim 1, wherein the power electronics module at least partially forms a sealing plane between the oil space of the transmission and a dry space of the transmission.

3. The transmission according to claim 1, wherein the power electronics module at least partially forms a sealing plane between the oil space of the transmission and an outside region.

4. The transmission according to claim 1, wherein the power electronics module has at least one connection for supplying coolant, and wherein the at least one connection is arranged outside the oil space of the transmission.

5. The transmission according to claim 1, wherein the power electronics module is at least partially encapsulated in an oil-tight manner with a molding compound.

6. The transmission according to claim 1, wherein the power electronics module has a connector arrangement for feeding power lines and data lines to the carrier element, the connector arrangement extending from the carrier element into an outside region of the transmission that is free from oil.

7. The transmission according to claim 1, wherein a transmission control module is at least partially integrated in the power electronics module.

8. A motor vehicle, comprising:
a transmission having a housing and a power electronics module, the power electronics module comprising:
a carrier element with at least one power switching element having a cooling surface; and
a cooling body,
wherein the cooling body is connected in a thermally conductive manner to the cooling surface of the at least one power switching element,
wherein the housing has an oil space, and
wherein the power electronics module is at least partially located inside the oil space of the transmission,
wherein the cooling body extends through an opening of the housing such that a first portion of the cooling body is within the housing and a second portion of the cooling body is outside the housing, and
wherein the cooling body includes a first cooling element forming the first portion of the cooling body and a second cooling element forming the second portion of the cooling body, wherein at least one cooling structure is included between the first cooling element and the second cooling element, and wherein the at least one cooling structure is configured for receiving a cooling medium circulating through the cooling body.

9. The motor vehicle according to claim 8, wherein the power electronics module at least partially forms a sealing plane between the oil space of the transmission and a dry space of the transmission.

10. The motor vehicle according to claim 8, wherein the power electronics module at least partially forms a sealing plane between the oil space of the transmission and an outside region.

11. The motor vehicle according to claim 8, wherein the power electronics module has at least one connection for supplying coolant, and wherein the at least one connection is arranged outside the oil space of the transmission.

12. The motor vehicle according to claim 8, wherein the power electronics module is at least partially encapsulated in an oil-tight manner with a molding compound.

13. The motor vehicle according to claim 8, wherein the power electronics module has a connector arrangement for feeding power lines and data lines to the carrier element, the connector arrangement extending from the carrier element into an outside region of the transmission that is free from oil.

14. The motor vehicle according to claim 8, wherein a transmission control module is at least partially integrated in the power electronics module.

15. A method comprising:
forming a transmission having a housing and a power electronics module, the power electronics module comprising:
a carrier element with at least one power switching element having a cooling surface; and
a cooling body,
wherein the cooling body is connected in a thermally conductive manner to the cooling surface of the at least one power switching element,
wherein the housing has an oil space, and
wherein the power electronics module is at least partially located inside the oil space of the transmission,
wherein the cooling body extends through an opening of the housing such that a first portion of the cooling body is within the housing and a second portion of the cooling body is outside the housing, and
wherein the cooling body includes a first cooling element forming the first portion of the cooling body and a second cooling element forming the second portion of the cooling body, wherein at least one cooling structure is included between the first cooling element and the second cooling element, and wherein the at least one cooling structure is configured for receiving a cooling medium circulating through the cooling body.

16. The method according to claim 15, wherein the power electronics module at least partially forms a sealing plane between the oil space of the transmission and a dry space of the transmission.

17. The method according to claim 15, wherein the power electronics module has at least one connection for supplying coolant, and wherein the at least one connection is arranged outside the oil space of the transmission.

* * * * *